United States Patent
Muto

(10) Patent No.: US 9,398,693 B2
(45) Date of Patent: Jul. 19, 2016

(54) CAPACITOR ARRANGEMENT STRUCTURE AND METHOD OF MOUNTING CAPACITOR

(71) Applicant: Toyota Jidosha Kabushiki Kaisha, Toyota-shi, Aichi-ken (JP)

(72) Inventor: Jun Muto, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/300,797

(22) Filed: Jun. 10, 2014

(65) Prior Publication Data

US 2014/0367154 A1     Dec. 18, 2014

(30) Foreign Application Priority Data

Jun. 13, 2013   (JP) ................. 2013-124922

(51) Int. Cl.
| | |
|---|---|
| H05K 1/18 | (2006.01) |
| H05K 3/30 | (2006.01) |
| H05K 1/02 | (2006.01) |
| H05K 1/16 | (2006.01) |
| H05K 1/11 | (2006.01) |
| H05K 3/24 | (2006.01) |

(52) U.S. Cl.
CPC ............ *H05K 1/181* (2013.01); *H05K 1/162* (2013.01); *H05K 1/165* (2013.01); *H05K 1/0296* (2013.01); *H05K 1/0298* (2013.01); *H05K 1/11* (2013.01); *H05K 3/247* (2013.01); *H05K 2201/0305* (2013.01); *H05K 2201/0979* (2013.01); *H05K 2201/09236* (2013.01); *H05K 2201/09254* (2013.01); *H05K 2201/09727* (2013.01); *H05K 2201/09736* (2013.01); *H05K 2201/10015* (2013.01); *H05K 2201/10522* (2013.01); *H05K 2203/043* (2013.01); *Y02P 70/611* (2015.11); *Y10T 29/43* (2015.01)

(58) Field of Classification Search
CPC ..... H05K 1/181; H05K 1/165; H05K 1/0296; H05K 3/303; H05K 1/11
USPC ................... 174/560, 260; 29/25.41; 361/782
See application file for complete search history.

(56) References Cited

U.S. PATENT DOCUMENTS

| | | | |
|---|---|---|---|
| 6,198,619 B1 | 3/2001 | Fijioka | |
| 8,325,307 B2 * | 12/2012 | Nishimura | ................... 349/141 |

(Continued)

FOREIGN PATENT DOCUMENTS

| | | |
|---|---|---|
| JP | 60-240104 A | 11/1985 |
| JP | H07175076 A | 7/1995 |

(Continued)

*Primary Examiner* — Timothy Thompson
*Assistant Examiner* — Charles Pizzuto
(74) *Attorney, Agent, or Firm* — Dinsmore & Shohl LLP

(57) ABSTRACT

A capacitor arrangement structure includes: a first wiring pattern; a second wiring pattern; a first electrode pattern that protrudes from the first wiring pattern toward the second wiring pattern; a second electrode pattern that protrudes from the second wiring pattern toward the first wiring pattern so as to run in parallel to the first electrode pattern; and a plurality of capacitors that are arranged in parallel between the first electrode pattern and the second electrode pattern.

13 Claims, 4 Drawing Sheets

(56) References Cited

U.S. PATENT DOCUMENTS

| | | |
|---|---|---|
| 2002/0097286 A1* | 7/2002 | Yasuda .................... 347/12 |
| 2002/0191138 A1* | 12/2002 | Matsumoto et al. ......... 349/141 |
| 2008/0047743 A1 | 2/2008 | Komatsu et al. |
| 2009/0097738 A1* | 4/2009 | Mamiya et al. ............. 382/150 |
| 2009/0167325 A1* | 7/2009 | Geaghan .................... 324/660 |
| 2009/0290317 A1* | 11/2009 | Mashino .................... 361/782 |
| 2010/0055557 A1* | 3/2010 | Meschter ................... 429/161 |
| 2012/0306513 A1* | 12/2012 | Stradinger ................. 324/693 |

FOREIGN PATENT DOCUMENTS

| | | | |
|---|---|---|---|
| JP | H0945218 | A | 2/1997 |
| JP | 11-307389 | A | 11/1999 |
| JP | 2000-183601 | A | 6/2000 |
| JP | 2000215813 | * | 8/2000 |
| JP | 2004-165535 | A | 6/2004 |
| JP | 2006-093680 | A | 4/2006 |
| JP | 2008123752 | * | 5/2008 |
| WO | 2006054601 | A1 | 5/2006 |

* cited by examiner

CAPACITOR ARRANGEMENT STRUCTURE AND METHOD OF MOUNTING CAPACITOR

INCORPORATION BY REFERENCE

The disclosure of Japanese Patent Application No. 2013-124922 filed on Jun. 13, 2013 including the specification, drawings and abstract is incorporated herein by reference in its entirety.

BACKGROUND OF THE INVENTION

1. Field of the Invention

The present invention relates to a technique for arranging capacitors between wiring patterns.

2. Description of Related Art

For example, Japanese Patent Application Publication No. 07-175076 (JP No. 07-175076 A) discloses a structure for equalizing wiring resistance values of many wirings in a liquid crystal display element.

SUMMARY OF THE INVENTION

When an electric current is smoothed by dividing between a plurality of capacitors, it is difficult to suppress a bias of an electric current flowing to each of the capacitors. The present invention provides a capacitor arrangement structure that can suppress a bias of an electric current that flows to each of capacitors, and a method of mounting capacitors.

A capacitor arrangement structure according to a first aspect of the present invention includes: a first wiring pattern; a second wiring pattern; a first electrode pattern protruding from the first wiring pattern toward the second wiring pattern; a second electrode pattern protruding from the second wiring pattern toward the first wiring pattern so as to run in parallel to the first electrode pattern; and a plurality of capacitors arranged in parallel between the first electrode pattern and the second electrode pattern.

Further, a method of mounting capacitors according to a second aspect of the present invention includes; arranging a plurality of capacitors in parallel between a plurality of first electrode patterns protruding from a first wiring pattern toward a second wiring pattern and a second electrode pattern protruding from the second wiring pattern toward the first wiring pattern so as to be sandwiched by the first electrode patterns; and adjusting resistances of the first electrode patterns depending on a length of a path from a current source connected to the first wiring pattern.

According to the present invention, a bias of an electric current that flows to each of the capacitors can be suppressed.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
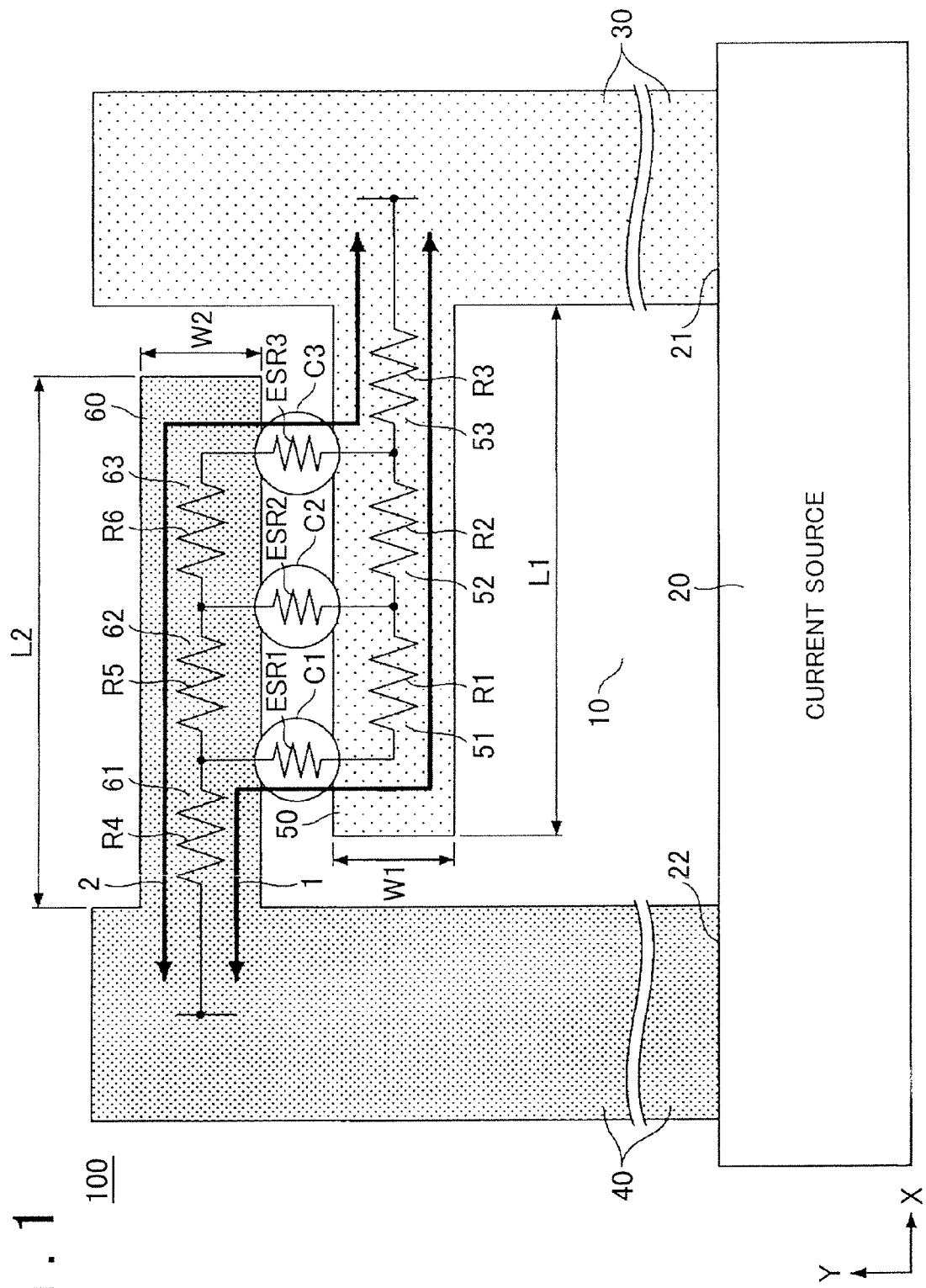
FIG. 1 is a plan view that schematically shows a capacitor arrangement structure according to a first embodiment of the present invention.

FIG. 1 is a plan view that schematically shows a configuration example of a capacitor arrangement structure 100 of a first embodiment. The capacitor arrangement structure 100 is a circuit structure that includes a substrate 10; a current source 20 formed on the substrate 10; a conductor pattern formed on the substrate 10; and a plurality of capacitors (three capacitors C1, C2 and C3 are illustrated in FIG. 1) mounted on the substrate 10. The current source 20 is a generator of electric currents that flow to the conductor pattern and a plurality of capacitors, which are formed on the substrate 10. The capacitor arrangement structure 100 includes a wiring pattern 30, a wiring pattern 40, an electrode pattern 50 and an electrode pattern 60, as conductor patterns formed on a surface of the substrate 10.

The capacitor arrangement structure 100 includes the wiring pattern 30 as a first wiring pattern, and the wiring pattern 40 as a second wiring pattern having a potential different from that of the first wiring pattern. The wiring pattern 40 is arranged, for example, so as to run parallel to the wiring pattern 30, that is, in the case of FIG. 1, the wiring pattern 30 and the wiring pattern 40 linearly extend in a Y direction parallel to a surface of the substrate 10.

The wiring pattern 30 is, for example, a planar high-potential power source pattern that is equipotentially connected to a high potential end 21 of the current source 20, and the wiring pattern 40 is a planar low-potential power source pattern that is equipotentially connected to a low potential end 22 of the current source 20.

The current source 20 includes the high potential end 21 connected to one end of the wiring pattern 30 and the low potential end 22 connected to one end of the wiring pattern 40. The high potential end 21 is an output end that outputs an electric current generated by the current source 20 to the wiring pattern 30, and the low potential end 22 is an input end to which an electric current that flows to the wiring pattern 40 is input.

The current source 20 is, for example, a generator of a ripple current in which a direction of electric conduction inverts periodically between the wiring pattern 30 and the wiring pattern 40. In this case, the high potential end 21 is an input/output end in or to which the ripple current that flows to the wiring pattern 30 is input or output, and the low potential end 22 is an input/output end in or to which the ripple current that flows to the wiring pattern 40 is input or output.

As a specific example of the current source 20 that generates such ripple current, a bridge circuit can be used. The bridge circuit is a circuit that has a switching element such as a transistor on a high side and a low side, for example, a circuit that is configured into an inverter or a power source device. When the current source 20 is the bridge circuit, the high potential end 21 is a positive electrode section that is equipotentially connected to a high potential side electrode (for example, a collector of a high-side IGBT) of a high-side switching element, and the low potential end 22 is a negative electrode section that is equipotentially connected to a low potential side electrode (for example, an emitter of a low-side IGBT) of a low-side switching element.

The capacitor arrangement, structure 100 includes the electrode pattern 50 as a first electrode pattern that protrudes from the first wiring pattern toward the second wiring pattern. The electrode pattern 50 is a planar pattern that stretches in a direction different from a direction in which the wiring pattern 30 extends, and is equipotentially connected to the wiring pattern 30 without being electrically connected to the wiring pattern 40. The electrode pattern 50 is, in the case of FIG. 1 for example, a rectangular pattern that linearly extends in an X direction parallel to a surface of the substrate 10 so as to be orthogonal to a direction in which the wiring pattern 30 extends, and has a width W1 in a Y direction and a length L1 in an X direction.

The capacitor arrangement structure 100 includes the electrode pattern 60 as a second electrode pattern that protrudes from the second wiring pattern toward the first wiring pattern so as to run in parallel to the first electrode pattern. The electrode pattern 60 is a planar pattern that stretches in a direction different from a direction in which the wiring pattern 40 extends, and is equipotentially connected to the wiring pattern 40 without being electrically connected to the wiring pattern 30. The electrode pattern 60 is, in the case of FIG. 1 for example, a rectangular pattern that linearly extends in an X direction parallel to a surface of the substrate 10 so as to be orthogonal to a direction in which the wiring pattern 40 extends, and has a width W2 in a Y direction and a length L2 in an X direction.

The capacitor arrangement structure 100 includes a plurality of capacitors C1, C2 and C3 arranged in parallel between adjacent electrode pattern 50 and electrode pattern 60. A capacitance of each of the capacitors C1, C2 and C3 may be the same. As a specific example of the capacitors C1, C2 and C3, a film capacitor, an aluminum electrolytic capacitor, a ceramic capacitor and a solid polymer capacitor can be used.

Since a plurality of the capacitors C1, C2 and C3 is arranged electrically parallel between the electrode pattern 50 and the electrode pattern 60 that run in parallel, electric currents that flow to each of the capacitors C1, C2 and C3 can be prevented from being biased. Therefore, since an electric current can be prevented from flowing excessively biased to, for example, a particular capacitor, a smoothing effect of an electric current due to a plurality of the capacitors is improved. Further, for example, since a magnitude of the ripple current that flows to each of the capacitors becomes smaller, loss and heat generation of the capacitors can be suppressed. Still further, for example, since the electric current can be prevented from flowing excessively biased to a particular capacitor, an electric current rating demanded on the capacitor as a capacitor specification can be lowered. Therefore, the capacitors can be readily miniaturized.

Further, since a plurality of adjacent capacitors C1, C2 and C3 is arranged between a face of the electrode pattern 50 and a face of electrode pattern 60 opposite to the face of the electrode pattern 50, the electrode pattern 50 and electrode pattern 60 are easy to form with a large width. Further, since a region where neither the capacitor nor the conductor pattern are arranged (dead space) can be reduced, a space necessary for mounting the capacitor arrangement structure 100 can be reduced, and the substrate 10 can be readily miniaturized.

The capacitor arrangement structure 100 illustrated in FIG. 1 has three paths that bind between the wiring pattern 30 and the wiring pattern 40 via any one of the capacitors C1, C2 and C3. Any of these three paths is a path that binds a connection site of the wiring pattern 30 and electrode pattern 50 and a connection site of the wiring pattern 40 and the electrode pattern 60. In FIG. 1, a path 1 and a path 2 are illustrated with an arrow mark. The path 1 is a path that passes only capacitor C1 of the capacitors C1, C2 and C3 and the path 2 is a path that passes only capacitor C3 of the capacitors C1, C2 and C3.

A resistance of the path 1 that passes only the capacitor C1 of the capacitors C1, C2 and C3 is a sum total of wiring resistances R1 to R4 and an equivalent series resistance ESR1. A resistance of a path that passes only the capacitor C2 of the capacitors C1, C2 and C3 is a sum total of wiring resistances R2 to R5 and an equivalent series resistance ESR2. A resistance of the path 2 that passes only the capacitor C3 of the capacitors C1, C2 and C3 is a sum total of wiring resistances R3 to R6 and an equivalent series resistance ESR3.

The wiring resistances R1 to R3 are resistances of the electrode pattern 50, and the wiring resistances R4 to R6 are resistances of the electrode pattern 60. The equivalent series resistances ESR1, ESR2 and ESR3, respectively, are resistances of the capacitor C1, C2 and C3.

The wiring resistance R1 is a resistance of an end portion 51 of the electrode pattern 50. The end portion 51 is a place that is sandwiched by a connection site of the capacitor C1 and the electrode pattern 50 and a connection site of the capacitor C2 and the electrode pattern 50. The wiring resistance R2 is a resistance of an intermediate section 52 of the electrode pattern 50. The intermediate section 52 is a place that is sandwiched by a connection site of the capacitor C2 and the electrode pattern 50 and a connection site of the capacitor C3 and the electrode pattern 50. The wiring resistance R3 is a resistance of a root section 53 of the electrode pattern 50. The root section 53 is a place sandwiched by a connection site of the capacitor C3 and the electrode pattern 50 and a connection site of the wiring pattern 30 and the electrode pattern 50.

A resistance of each of places of an end portion 63, the intermediate section 62 and the root section 61 of the electrode pattern 60 is the same as the case of the electrode pattern 50 described above.

The paths that pass any one of capacitors C1, C2 and C3 are preferable to have the same resistance each other. Thus, since the electric current that flows to each of the capacitors can be more suppressed from fluctuating, the electric current can be flowed equally to each of the capacitors. For example, when the equivalent series resistances ESR1, ESR2 and ESR3 are set to be the same with each other and the wiring resistances R1 to R6 are set to be the same with each other, the resistances of the paths that pass any one of the adjacent capacitor C1, C2 and C3 are the same with each other.

Further, for example, when cross-section areas of the respective places of the electrode pattern 50 and the electrode pattern 60 are equal, resistance value per unit length of the electrode pattern 50 is equal to the resistance value per unit length of the electrode pattern 60. Therefore, in this case, the capacitors C1, C2 and C3 may be arranged in parallel at an equidistance such that a resistance of each of paths that pass any one of the capacitors C1, C2 and C3 may be the same each other.

Figure 2:
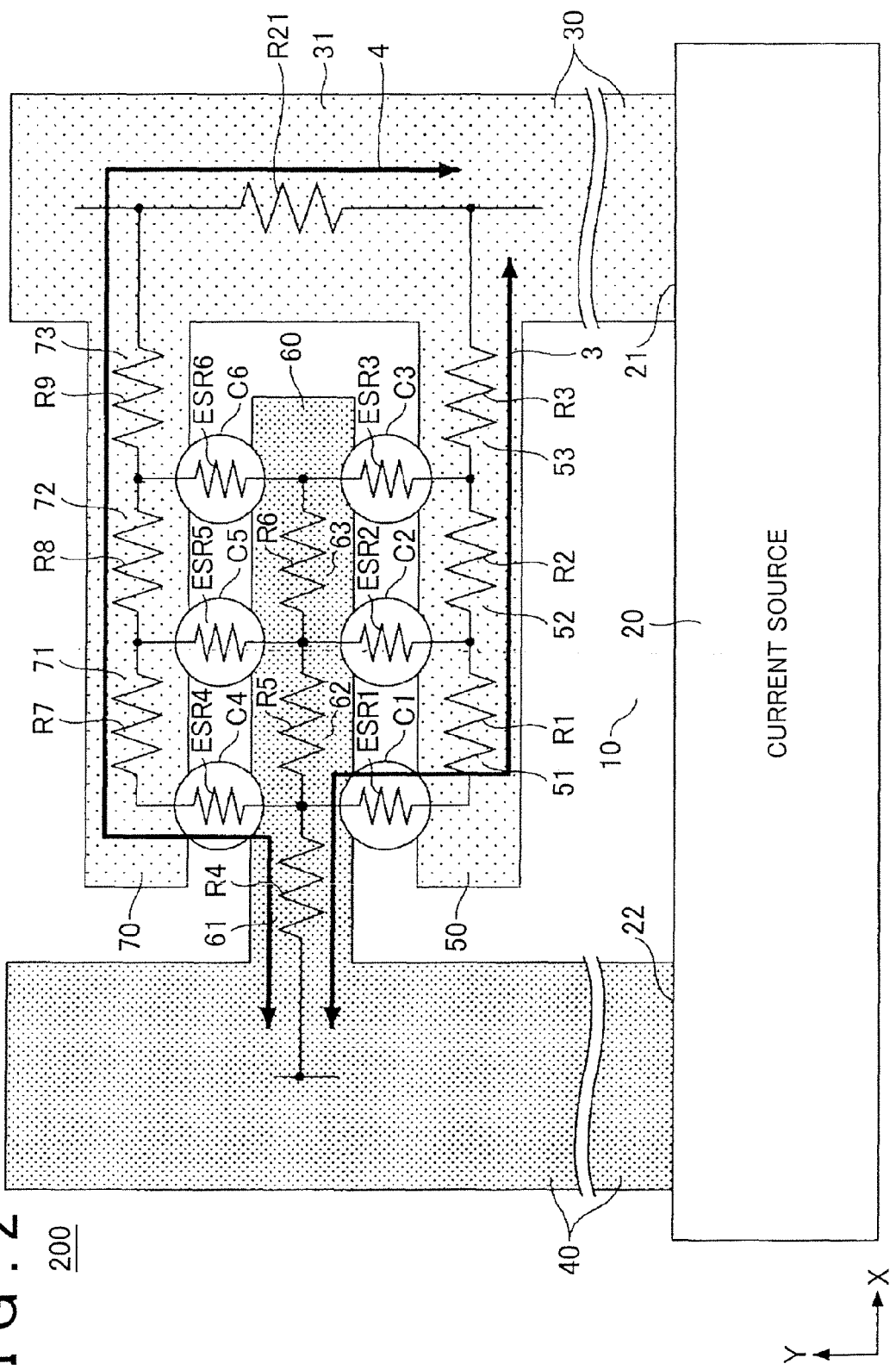
FIG. 2 is a plan view that schematically shows a capacitor arrangement structure according to a second embodiment of the present invention.

FIG. 2 is a plan view that schematically shows a configuration example of a capacitor arrangement structure 200 according to a second embodiment. Since the embodiment of FIG. 2 has the same configuration and effects as the embodiment described above, description of the configuration and effects will be omitted or simplified. The capacitor arrangement structure 200 of FIG. 2 has a plurality of electrode patterns that protrudes from at least one wiring pattern formed in a pectinate shape.

The capacitor arrangement structure 200 is a circuit structure that includes the substrate 10, the current source 20 formed on the substrate 10, a conductor pattern formed on the substrate 10, and a plurality of capacitors (6 capacitors C1 to C6 are illustrated in FIG. 2) mounted on the substrate 10. The capacitor arrangement structure 200 includes, as the conductor pattern formed on a surface of the substrate 10, the wiring pattern 30, the wiring pattern 40, the electrode pattern 50, the electrode pattern 60 and an electrode pattern 70.

The capacitor arrangement structure 200 has a mode in which an electrode pattern that protrudes from one first wiring pattern and an electrode pattern that protrudes from the other second wiring pattern are alternately arranged. In the case of FIG. 2, the capacitor arrangement structure 200 has two electrode patterns 50 and 70 that protrude from the wiring pattern 30 as the electrode pattern that protrudes from one electrode pattern, and one electrode pattern 60 that protrudes from the wiring pattern 40 as the electrode pattern that protrudes from the other wiring pattern.

The electrode pattern 70 is a planar pattern that stretches in a direction different from a direction in which the wiring pattern 30 extends, and is equipotentially connected to the wiring pattern 30 without being electrically connected to the wiring pattern 40. The electrode pattern 70 is, in the case of FIG. 2 for example, a rectangular pattern that linearly extends in an X direction parallel to a surface of the substrate 10 so as to be orthogonal to a direction in which the wiring pattern 30 extends, and has an external dimension (a width W1 in a Y direction and a length L1 in an X direction) the same as that of the electrode pattern 50.

The electrode pattern 50 is an electrode pattern that has a shortest conductor path length on the wiring pattern 30 from the high potential end 21 of the current source 20 to a protruded site among a plurality of the electrode patterns 50 and 70 that protrude from the wiring pattern 30. On the other hand, the electrode pattern 70 is an electrode pattern that has a shortest conductor path length on the wiring pattern 30 from the high potential end 21 of the current source 20 to a protruded site that is longer than the shortest conductor path of the electrode pattern 50. The electrode pattern 60 is an electrode pattern that extends between the electrode pattern 50 and the electrode pattern 70 so as to run in parallel in a state sandwiched by the electrode pattern 50 and the electrode pattern 70.

The capacitor arrangement structure 200 includes a plurality of capacitors C1, C2 and C3 arranged in parallel between adjacent electrode pattern 50 and electrode pattern 60 and a plurality of capacitors C4, C5 and C6 arranged in parallel between adjacent electrode pattern 70 and electrode pattern 60. An arrangement mode of the capacitors C4, C5 and C6 is the same as the arrangement mode of C1, C2 and C3. A capacitance of each of the capacitors C1 to C6 may be the same. As a specific example of the capacitors C1 to C6, a film capacitor, an aluminum electrolytic capacitor, a ceramic capacitor and a solid polymer capacitor can be used.

The capacitor arrangement structure 200 illustrated in FIG. 2 has 6 paths that bind between the wiring pattern 30 and the wiring pattern 40 via any one of the capacitors C1 to C6. Any of the 6 paths is a path that binds a connection site between the wiring pattern 30 and the electrode pattern 50 and a connection site between the wiring pattern 40 and the electrode pattern 60. In FIG. 2, a path 3 and a path 4 are illustrated with an arrow mark. The path 3 is a path that passes only the capacitor C1 among the capacitors C1, C2 and C3, and the path 4 is a path that passes only the capacitor C4 among the capacitors C4, C5 and C6.

A resistance of the path 4 that passes only the capacitor C4 among the capacitors C4, C5 and C6 is a sum total of wiring resistances R4, R7 to R9, and R21 and the equivalent series resistance ESR4. A resistance of a path that passes only the capacitor C5 among the capacitors C4, C5 and C6 is a sum total of wiring resistances R4, R5, R8, R9, and R21 and the equivalent series resistance ESR5. A resistance of a path that passes only the capacitor C6 among the capacitors C4, C5 and C6 is a sum total of wiring resistances R4 to R6, R9, and R21 and the equivalent series resistance ESR6.

The wiring resistances R7 to R9 are resistances of the electrode pattern 70. The equivalent series resistances ESR4, ESR5 and ESR6 respectively are resistances of the capacitors C4, C5 and C6. Each of resistances of an end portion 71, an intermediate section 72 and a root section 73 of the electrode pattern 70 is the same as the case of the electrode pattern 50 described above.

The wiring resistance R21 is a resistance of the intermediate section 31 of the wiring pattern 30. The intermediate section 31 is a place that is sandwiched by a connection site of the electrode pattern 50 and wiring pattern 30 and a connection site of the electrode pattern 70 and the wiring pattern 30. The connection site of the electrode pattern 50 and the wiring pattern 30 is a branching site of a path that directs to the electrode pattern 50 and a path that directs to the electrode pattern 70.

The electrode pattern 50 and the electrode pattern 70 are disposed in parallel so as to protrude from the wiring pattern 30 to one end of which the current source 20 is connected. Therefore, a shortest conductor path length from the high potential end 21 to a site where the electrode pattern 50 protrudes is different from a shortest conductor path length from the high potential end 21 to a site where the electrode pattern 70 protrudes by a length of the intermediate section 31.

For example, while a path that passes any one of the capacitors C4 to C6 (such as path 4) passes the intermediate section 31, a path that passes any one of capacitors C1 to C3 (such as path 3) does not pass the intermediate section 31. Therefore, between the path that passes any one of the capacitors C1 to C3 and the path that passes any one of the capacitors C4 to C6, a bias of the energizing current due to the wiring resistance R21 of the intermediate section 31 is generated.

The electrode pattern 50 and electrode patter 70 have mutually different resistances depending on the shortest path lengths on the wiring pattern 30 from the high potential end 21 of the current source 20 to a protruded site. Thus, even when there is the wiring resistance R21 of the intermediate section 31, each of the resistances of the electrode pattern 50 and electrode pattern 70 can be set to a resistance value capable of suppressing a bias of the electric current that flows to each of the capacitors C1 to C6. For example, the electrode pattern 70 that has a longer shortest path length, when it has a resistance lower than that of the electrode pattern 50 that has a shorter shortest path length, can effectively suppress an electric current that flows to each of the capacitors C1 to C6 from biasing.

On the other hand, when each of the paths that pass any one of the capacitors C1 to C6 has the same resistance each other, an electric current can be flowed equally to each of the capacitors C1 to C6. However, when the equivalent series resistances ESR1 to ESR6 are designed to be the same value each other and the wiring resistances R1 to R9 are designed to be the same value each other, it is necessary to adjust a bias of an energizing current due to the wiring resistance R21 of the intermediate section 31.

When the equivalent series resistances ESR1 to ESR6 are designed to be the same value each other and the wiring resistances R1 to R9 are designed to be the same values each other, at least one of the wiring resistance R9 and the wiring resistance R3 may be adjusted such that a relationship of formula 1 is satisfied.

The wiring resistance $R9$+The wiring resistance $R21$=The wiring resistance $R3$   formula 1

Thus, an electric current can be flowed equally to each of the capacitors C1 to C6.

The wiring resistance R9 is a wiring resistance of the root section 73 of the electrode pattern 70, and the wiring resistance R3 is a wiring resistance of the root section 53 of the electrode pattern 50. For example, the wiring resistance R9 may be adjusted to be lower than the wiring resistance R3, or the wiring resistance R3 may be adjusted to be higher than the wiring resistance R9. In this case, the root section 73 and the root section 53 have mutually different resistances. The wiring resistance R21 may be adjusted such that the relationship of the formula 1 is satisfied.

The wiring resistance may be adjusted by varying a length of a pattern or may be adjusted by varying a cross-sectional area of the pattern. For example, by adjusting such that the root section 73 has a larger cross-sectional area than that of the root section 53, the wiring resistance R9 of the root section 73 can be adjusted to be lower than the wiring resistance R3 of the root section 53. In this case, the root section 73 and the root section 53 have mutually different cross-sectional areas.

Figure 3:
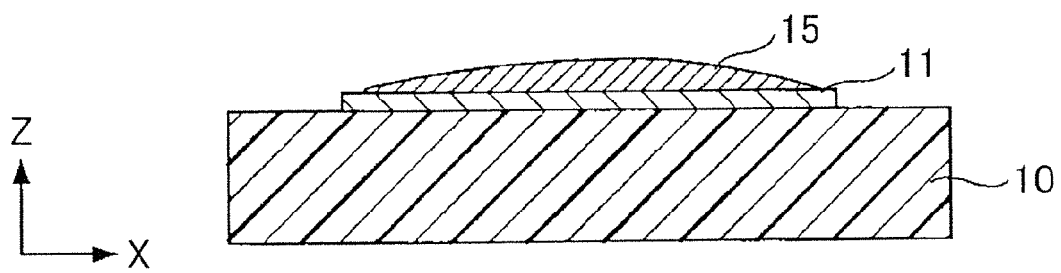
FIG. 3 is a cross-sectional view that schematically shows a part of the capacitor arrangement structure of the present invention.

FIG. 3 is a cross-sectional view that schematically shows a part of the capacitor arrangement structure for describing an example where the wiring resistance is adjusted by varying a cross-sectional area of a pattern. A pattern 11 formed on a surface of the substrate 10 corresponds to a pattern of a root section of the electrode pattern. When an amount of a solder 15 attached to the pattern 11 is adjusted, a cross-sectional area of the pattern 11 (in particular, a thickness in a Z direction of the pattern 11) can be adjusted.

For example, in FIG. 2, as a distance from the current source 20 increases, an amount of the solder applied to the root section is adjusted to increase. An amount of the solder applied to the root section 73 is larger than an amount of the solder applied to the root section 53. Without applying the solder to the root section 53, the solder may be applied to the root section 73.

When the solder is applied to the pattern, for example, the solder may be applied to a copper pattern exposed from the covered pattern. Further, an amount of the solder may be adjusted by a metal mask opening in the case of reflow, by a solder feed rate in the case of a soldering iron, and by an exposed area of a copper land in the case of flow.

Figure 4:
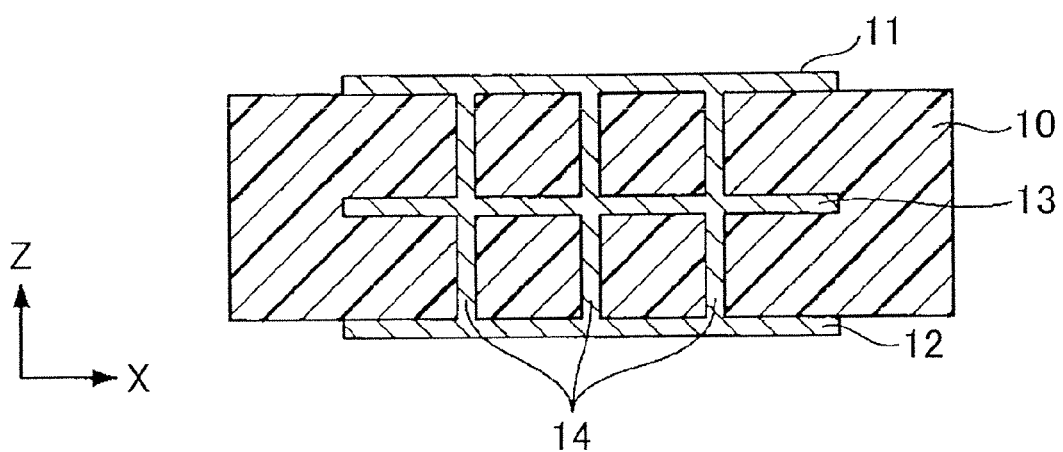
FIG. 4 is a cross-sectional view that schematically shows a part of the capacitor arrangement structure of the present invention.

FIG. 4 is a cross-sectional view that schematically shows a part of the capacitor arrangement structure for describing an example where the wiring resistance is adjusted by varying a cross-sectional area of a pattern. A pattern 11 formed on a surface of the substrate 10 corresponds to a pattern of the root section of the electrode pattern. By adjusting magnitudes of separate patterns 12 and 13 electrically connected to the pattern 11, a cross-sectional area of the pattern 11 can be adjusted. That is, by combining the resistances of the separate patterns 12 and 13 and the resistance of the pattern 11, the resistance of the pattern 11 can be lowered.

The patterns 12 and 13 are patterns formed on the layer separate from that of the electrode pattern, that is, the pattern 13 is a pattern formed in an inner layer of the substrate 10, and the pattern 12 is a pattern formed on a surface on the opposite side from the surface on which the pattern 11 is formed in the substrate 10. The pattern 11 and patterns 12 and 13 are electrically connected via through-holes 14.

For example, in FIG. 2, as a distance from the current source 20 increases, a magnitude of a separate pattern connected to the root section is adjusted to be larger. A magnitude of the separate pattern connected to the root section 73 is larger than the magnitude of the separate pattern connected to the root section 53. Without connecting the separate pattern to the root section 53, the separate pattern may be connected to the root section 73.

Figure 5:
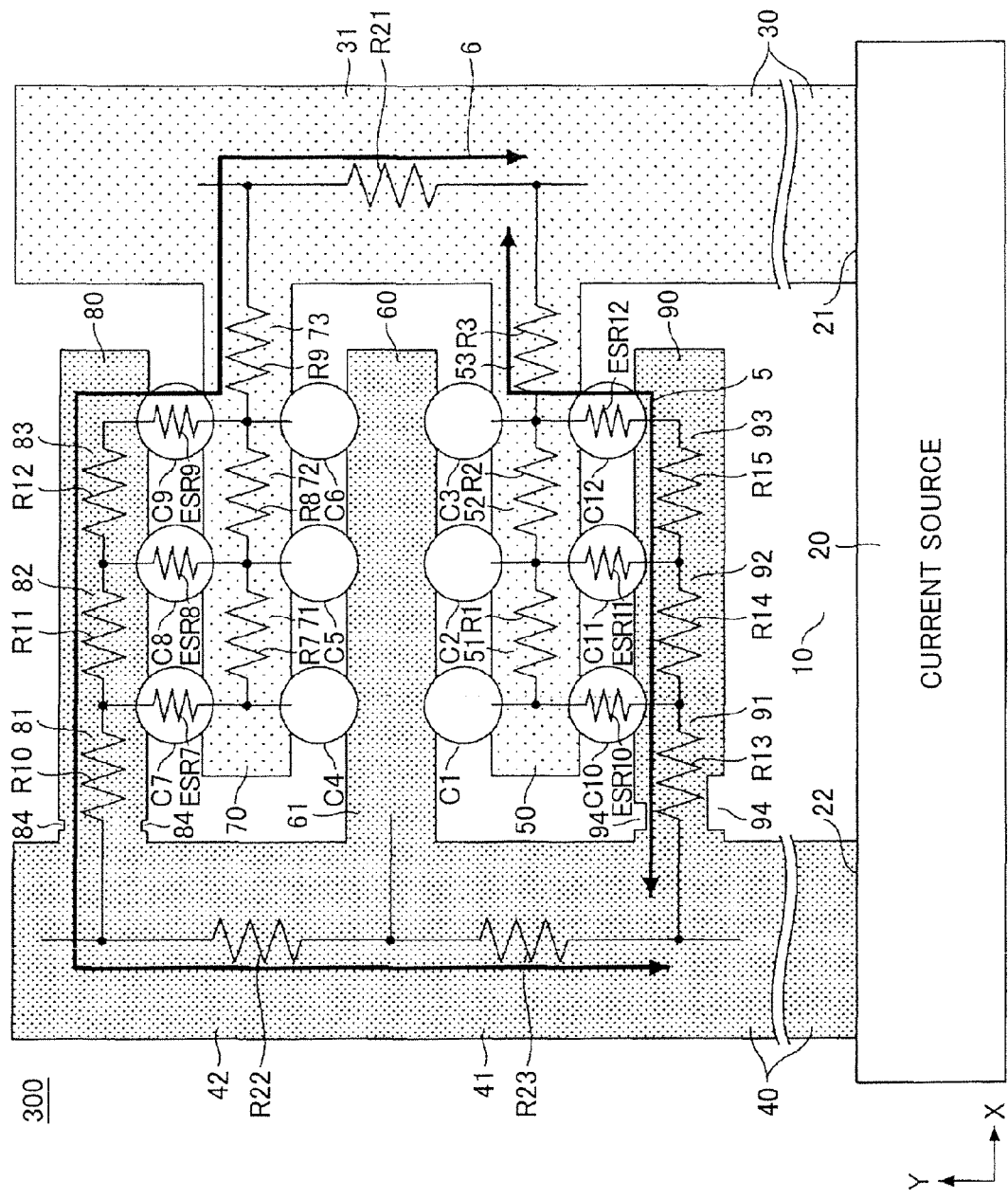
FIG. 5 is a plan view that schematically shows a configuration example of a capacitor arrangement structure according to a third embodiment of the present invention.

Further, as shown in FIG. 5 (a detailed description of FIG. 5 will be described below), by adjusting magnitudes of notches 84 and 94 that are formed on the root sections 81 and 91 of the electrode patterns 80 and 90, cross-sectional areas (a width in a Y direction, in particular) of the root sections 81 and 91 can be adjusted. The electrode pattern 80 includes the root section 81, an intermediate section 82, and a root section 83. The electrode pattern 90 includes the root section 91, an intermediate section 92, and a root section 93.

For example, in FIG. 5, a magnitude of the notch disposed at the root section is adjusted to be smaller as a distance from the current source 20 increases. The magnitude of the notch 84 disposed to the root section 81 is smaller than the magnitude of the notch 94 disposed to the root section 91. Without disposing the notch to the root section 81, a notch may be disposed to the root section 91.

These methods of adjusting the wiring resistances may be used in combination.

The wiring resistance may be adjusted in advance in a designing step before production of the capacitor arrangement structure and may be adjusted in a process of producing the capacitor arrangement structure. For example, in the process of producing the capacitor arrangement structure, a capacitor mounting method that includes a capacitor arrangement step and a resistance adjusting step is used.

The capacitor arrangement step is, in FIG. 2 for example, a step in which a plurality of capacitors C1 to C6 are arranged in parallel between the electrode patterns 50 and 70 and the electrode pattern 60. The resistance adjusting step is, in FIG. 2 for example, like the adjustment examples described above of the wiring resistance, a step of adjusting resistances (in particular, resistances of the root sections 53 and 73) of the electrode patterns 50 and 70 depending on a shortest path length from the current source 20 connected to the wiring pattern 30.

FIG. 5 is a plan view that schematically shows a configuration example of a capacitor arrangement structure 300 according to a third embodiment. Since the embodiment of FIG. 5 has the same configuration and effects as the embodiments described above, description of the configuration and effects will be omitted or simplified. The capacitor arrangement structure 300 of FIG. 5 has a plurality of electrode patterns protruding from both of wiring patterns alternately, which run in parallel, formed in pectinate shape. The capacitor arrangement structure 300 has a configuration obtained by adding electrode patterns 80 and 90 and capacitors C7 to C12 to the configuration of FIG. 2. In FIG. 5, a part of configuration that duplicates with FIG. 2 is omitted.

The electrode pattern 90 is an electrode pattern that has a shortest conductor path length on the wiring pattern 40 from the low potential end 22 of the current source 20 to a protruded site among a plurality of electrode patterns 60, 80 and 90 protruding from the wiring pattern 40. On the other hand, the electrode pattern 80 is an electrode pattern that has a shortest conductor path length on the wiring pattern 40 from the low potential end 22 of the current source 20 to a protruded site longer than the shortest conductor path of the electrode patterns 60 and 90. The electrode pattern 50 is an electrode pattern that extends between the electrode pattern 60 and the electrode pattern 90 so as to run in parallel in a state sandwiched by the electrode pattern 60 and the electrode pattern 90. The electrode pattern 70 is an electrode pattern that extends between the electrode pattern 60 and the electrode pattern 80 so as to run in parallel in a state sandwiched by the electrode pattern 60 and the electrode pattern 80.

The capacitor arrangement structure 300 includes a plurality of capacitors C7, C8 and C9, which are arranged in parallel between adjacent electrode pattern 70 and electrode pattern 80, and a plurality of capacitors C10, C11 and C12, which are arranged in parallel between adjacent electrode pattern 50 and electrode pattern 90. The arrangement modes of the capacitors C7, C8 and C9 and capacitors C10, C11 and C12 are the same as that of the capacitors C1, C2 and C3. A capacitance of each of the capacitors C1 to C12 may be the same. As a specific example of the capacitors C1 to C12, a film capacitor, an aluminum electrolytic capacitor, a ceramic capacitor, and a solid polymer capacitor can be used.

The capacitor arrangement structure 300 illustrated in FIG. 5 has twelve paths that bind between the wiring pattern 30 and the wiring pattern 40 via any one of the capacitors C1 to C12. Any of these twelve paths is a path that binds a connection site of the wiring pattern 30 and the electrode pattern 50 and a connection site of the wiring pattern 40 and the electrode pattern 90. In FIG. 5, a path 5 and a path 6 are illustrated with an arrow mark. The path 5 is a path that passes only the capacitor C12 among the capacitors C10, C11 and C12, and the path 6 is a path that passes only the capacitor 9 among the capacitors C7, C8 and C9.

The same as the case of FIG. 2, while a path that passes any one of the capacitors C7 to C9 (such as path 6) passes an intermediate section 31, 41 and 42, a path that passes any one of the capacitors C10 to C12 (such as path 5) does not pass the intermediate sections 31, 41 and 42. Thus, between a path that passes any one of the capacitors C7 to C9 and a path that passes any one of the capacitors C10 to C12, a bias of the energizing current due to the wiring resistances R21, R23 and R22 of the intermediate sections 31, 42 and 41 is generated.

However, the same as above, each of paths that pass any one of the capacitors C1 to C12, when having the same resistance each other, can equally flow an electric current to each of the capacitors C1 to C12. However, when the equivalent series resistances ESR1 to ESR12 are designed to be the same value each other and the wiring resistances R1 to R15 are designed to be the same value each other, it is necessary to adjust a bias of an energizing current due to the wiring resistances R21, R22 and R23 of the intermediate sections 31, 42 and 41.

When the equivalent series resistances ESR1 to ESR12 are designed to be the same value each other and the wiring resistances R1 to R15 are designed to be the same value each other, at least one of the wiring resistance R9 and the wiring resistance R3 may be adjusted such that a relationship of formula 2 is satisfied.

The wiring resistance $R9$+The wiring resistance $R21$ to $R23$=The wiring resistance $R3$     formula 2

Thus, an electric current can be flowed equally to each of the capacitors C1 to C12.

Alternatively, when the equivalent series resistances ESR1 to ESR12 are designed to be the same value each other and the wiring resistances R1 to R15 are designed to be the same value each other, at least one of the wiring resistance R10 and the wiring resistance R13 may be adjusted such that a relationship of formula 3 is satisfied.

The wiring resistance $R10$+The wiring resistance $R21$ to $R23$=The wiring resistance $R13$     formula 3

Thus, even when the equivalent series resistances ESR1 to ESR12 are designed to be the same value each other and the wiring resistances R1 to R15 are designed to be the same value each other, an electric current can be flowed equally to each of the capacitors C1 to C12.

The wiring resistance R10 is a wiring resistance of the root section 81 of the electrode pattern 80, and the wiring resistance R13 is a wiring resistance of the root section 91 of the electrode pattern 90.

An adjustment example of the wiring resistance may be the same as above. Further, the wiring resistances R21, R22 and R23 may be adjusted such that a relationship of formula 2 or formula 3 is satisfied.

In the above, the capacitor arrangement structures were described with reference to embodiments. However, the present invention is not limited to the embodiments described above. Various modifications and improvements such as combinations with or substitutions by a part or an entirety of other embodiments are possible within the range of the present invention.

For example, in the embodiments described above, as the first wiring pattern, the wiring pattern 30 is illustrated, and as the second wiring pattern having a potential different from that of the first wiring pattern, the wiring pattern 40 is illustrated. However, the first wiring pattern may be the wiring pattern 40 and the second wiring pattern may be the wiring pattern 30.

Further, the capacitor arrangement structure may include, in FIG. 2 for example, one electrode pattern that protrudes from the wiring pattern 30 and two electrode patterns that protrude from the wiring pattern 40 so as to run in parallel to the one electrode pattern.

Still further, the current source 20 may be a battery and number of the capacitors that are arranged in parallel is optional.

What is claimed is:

1. A capacitor arrangement structure comprising:
   a first wiring pattern;
   a second wiring pattern;
   a first electrode pattern that protrudes from the first wiring pattern toward the second wiring pattern;
   a second electrode pattern that protrudes from the second wiring pattern toward the first wiring pattern so as to run in parallel to the first electrode pattern; and
   a plurality of capacitors that are arranged in parallel between the first electrode pattern and the second electrode pattern.

2. The capacitor arrangement structure according to claim 1, wherein a plurality of paths each of which extends the first wiring pattern and the second wiring pattern via any one of the capacitors are included, and a plurality of the paths has the same resistance.

3. The capacitor arrangement structure according to claim 1, wherein the first electrode pattern and the second electrode pattern are alternately arranged.

4. The capacitor arrangement structure according to claim 3, wherein a plurality of the first electrode patterns have mutually different resistances depending on a length of a path from a current source connected to the first wiring pattern.

5. The capacitor arrangement structure according to claim 3, wherein, among a plurality of the first electrode patterns, an electrode pattern that has a longer path from a current source connected to the first wiring pattern has a resistance lower than an electrode pattern that has a shorter path from the current source.

6. The capacitor arrangement structure according to claim 4, wherein the plurality of the first electrode patterns have mutually different resistances at predetermined positions.

7. The capacitor arrangement structure according to claim 6, wherein cross-sectional areas of the predetermined positions are mutually different.

8. The capacitor arrangement structure according to claim 7, wherein amounts of a solder at the predetermined positions are mutually different.

9. The capacitor arrangement structure according to claim 7, wherein magnitudes of separate patterns connected to the predetermined positions are mutually different.

10. The capacitor arrangement structure according to claim 7, wherein notches are disposed at the predetermined positions and magnitudes of the notches are mutually different.

11. The capacitor arrangement structure according to claim 6, wherein the predetermined positions are root sections between the capacitor and the first wiring pattern.

12. The capacitor arrangement structure according to claim 1, further comprising a current source that is a generator of a ripple current, which is connected to the first wiring pattern and the second wiring pattern and inverts a direction of electric conduction between the first wiring pattern and the second wiring pattern.

13. A method of mounting a capacitor comprising:
arranging a plurality of capacitors in parallel between a plurality of first electrode patterns that protrude from a first wiring pattern toward a second wiring pattern and a second electrode pattern that protrudes from the second wiring pattern toward the first wiring pattern so as to be sandwiched by the first electrode patterns; and
adjusting resistances of the first electrode patterns depending on a length of a path from a current source connected to the first wiring pattern.

* * * * *